(12) United States Patent
Xie et al.

(10) Patent No.: US 8,716,188 B2
(45) Date of Patent: May 6, 2014

(54) STRUCTURE TO REDUCE ELECTROPLATED STABILIZER CONTENT

(75) Inventors: Yi-Yuan Xie, Waterford, NY (US); Kenneth P. Lenseth, Voorheesville, NY (US); Justin Waterman, Sand Lake, NY (US); Venkat Selvamanickam, Houston, TX (US)

(73) Assignee: SuperPower, Inc., Schenectady, NY (US)

( * ) Notice: Subject to any disclaimer, the term of this patent is extended or adjusted under 35 U.S.C. 154(b) by 717 days.

(21) Appl. No.: 12/882,654

(22) Filed: Sep. 15, 2010

(65) Prior Publication Data

US 2012/0065074 A1    Mar. 15, 2012

(51) Int. Cl.
*H01L 39/24* (2006.01)
*H01B 12/02* (2006.01)

(52) U.S. Cl.
USPC ........ 505/234; 505/220; 505/430; 174/125.1; 174/84 R; 29/599

(58) Field of Classification Search
CPC .............................. H01L 39/02; H01B 12/02
USPC ......... 505/220, 234, 236, 237, 470, 925–927; 174/125.1, 15.6, 84 R; 29/599, 825
See application file for complete search history.

(56) References Cited

U.S. PATENT DOCUMENTS

| | | |
|---|---|---|
| 3,458,293 A | 7/1969 | Schindler |
| 3,720,777 A | 3/1973 | Sampson et al. |
| 3,954,572 A | 5/1976 | Ziegler et al. |
| 4,333,228 A | 6/1982 | Koch |
| 4,560,445 A | 12/1985 | Hoover et al. |
| 4,652,346 A | 3/1987 | Polan |

(Continued)

FOREIGN PATENT DOCUMENTS

| | | |
|---|---|---|
| EP | 0398374 A2 | 11/1990 |
| EP | 0545608 A2 | 6/1993 |

(Continued)

OTHER PUBLICATIONS

O. Herbelot, et al., "Superconducting Cable Joint Resistance", IEEE Transactions on Magnetics, vol. 27, No. 2, Mar. 1991, pp. 1850-1853.

(Continued)

*Primary Examiner* — Stanley Silverman
*Assistant Examiner* — Kallambella Vijayakumar
(74) *Attorney, Agent, or Firm* — Thomas P. Weber; Abel Law Group, LLP

(57) ABSTRACT

A superconducting article includes first and second stacked conductor segments. The first stacked conductor segment includes first and second superconductive segments and has a nominal thickness $t_{n1}$. The second stacked conductor segment includes third and forth superconductive segments and has a nominal thickness $t_{n2}$. The superconducting article further includes a joint region comprising a first splice connecting the first and third superconductive segments together and a second splice connecting the second and forth superconductive segments together. The first splice is adjacent to and bridged portions of the first and third superconductive segments along at least a portion of the joint region, and the second splice is adjacent to and bridged portions of the second and forth superconductive segments along at least a portion of the joint region. The joint region has a thickness $t_{jr}$, wherein $t_{jr}$ is not greater than at least one of $1.8t_{n1}$ and $1.8t_{n2}$.

10 Claims, 10 Drawing Sheets

(56) References Cited

U.S. PATENT DOCUMENTS

| | | | |
|---|---|---|---|
| 4,673,774 A | 6/1987 | Wake et al. | |
| 5,299,728 A | 4/1994 | King et al. | |
| 5,358,929 A | 10/1994 | Fujikami et al. | |
| 5,480,861 A | 1/1996 | Tanaka et al. | |
| 5,801,124 A | 9/1998 | Gamble et al. | |
| 5,843,584 A | 12/1998 | Raber | |
| 5,912,607 A | 6/1999 | Kalsi et al. | |
| 5,987,342 A | 11/1999 | Scudiere et al. | |
| 6,159,905 A | 12/2000 | Buzcek et al. | |
| 6,187,166 B1 | 2/2001 | Moehle et al. | |
| 6,190,752 B1 | 2/2001 | Do et al. | |
| 6,230,033 B1 | 5/2001 | Scudiere et al. | |
| 6,271,474 B1 | 8/2001 | Fujikami et al. | |
| 6,309,767 B1 | 10/2001 | Nies | |
| 6,444,917 B1 | 9/2002 | Scudiere et al. | |
| 6,469,253 B1 | 10/2002 | Saga et al. | |
| 6,561,412 B2 | 5/2003 | Maeda et al. | |
| 6,584,333 B1 | 6/2003 | Gauss et al. | |
| 6,765,151 B2 * | 7/2004 | Fritzemeier et al. | 174/125.1 |
| 6,828,507 B1 | 12/2004 | Fritzemeier et al. | |
| 7,071,148 B1 * | 7/2006 | Selvamanickam et al. | 505/234 |
| 7,109,151 B2 | 9/2006 | Lee et al. | |
| 7,774,035 B2 | 8/2010 | Lee et al. | |
| 2002/0144838 A1 | 10/2002 | Fritzemeier et al. | |
| 2004/0248743 A1 | 12/2004 | Norton et al. | |
| 2004/0266628 A1 * | 12/2004 | Lee et al. | 505/238 |
| 2005/0016759 A1 * | 1/2005 | Malozemoff et al. | 174/125.1 |
| 2005/0173679 A1 | 8/2005 | Mannhart et al. | |
| 2006/0073979 A1 | 4/2006 | Thieme et al. | |
| 2009/0298696 A1 * | 12/2009 | Otto et al. | 505/230 |
| 2010/0022396 A1 * | 1/2010 | Otto et al. | 505/231 |
| 2010/0173784 A1 | 7/2010 | Lee et al. | |

FOREIGN PATENT DOCUMENTS

| | | |
|---|---|---|
| JP | 5072595 | 6/1975 |
| JP | 1302676 A | 12/1989 |
| JP | 4098773 A | 3/1992 |
| JP | 4218216 A | 8/1992 |
| JP | 5101725 A | 4/1993 |
| JP | 6005342 A | 1/1994 |
| JP | 6096828 | 4/1994 |
| JP | 7073758 A | 3/1995 |
| JP | 7073759 A | 3/1995 |
| JP | 7105751 A | 4/1995 |
| JP | 07335051 A | 12/1995 |
| WO | 8002084 A1 | 10/1980 |
| WO | 0058530 A1 | 10/2000 |
| WO | 0108169 A2 | 2/2001 |
| WO | 0152393 A1 | 7/2001 |
| WO | 03071611 A1 | 8/2003 |
| WO | 2005/055275 A2 | 6/2005 |
| WO | 2006/110637 A2 | 10/2006 |

OTHER PUBLICATIONS

P.A. Klaudy, et al., "Practical Conclusions from Field Trials of a Superconducting Cable", IEEE Transactions on Magnetics, vol. MAG-19, No. 3, May 1933, pp. 656-661.

K.G. Herd, et al., "Development and Fabrication of a Bi-2223 Racetrack Coil for Generator Applications", IEEE Transactions on Applicated Superconductivity, vol. 7, No. 2, Jun. 1997, pp. 531-534.

Fu, Y. et al., "Cooper Stabilization of YBCO Coated Conductor for Quench Protection", Syposium, Aug. 9, 2002, Applied Superconductivity Conference & Expo (and accompanying article, 4 pages).

Cantoni, C., et al., "Conductive Buffer Layers and Overlayers for the Thermal Stability of Coated Conductors", Article, Mar. 2001, 4 pages. vol. 11, No. 1, Institute of Electrical & Electronics Engineers, New York, U.S.A.

Larbalestier, David, et al., "High-Tc Superconducting Materials for Electric Power Applications", Nature, vol. 414, Nov. 15, 2001, pp. 368-377.

M.C. Ahn et al.:"Current limiting charateristics of coated conductos with various stabilizers"Cryogenics, vol. 47, No. 7-8 Jul. 1, 2007, pp. 425-430.

International Search Report or PCT/US06/13278, dated Nov. 22, 2006, 1 pg.

International Search Report or PCT/US2011/051568, dated Feb. 23, 2012, 1 pg.

* cited by examiner

STRUCTURE TO REDUCE ELECTROPLATED STABILIZER CONTENT

BACKGROUND

Superconductor materials have long been known and understood by the technical community. Low-temperature superconductors (low-$T_c$ or LTS) exhibiting superconducting properties at temperatures requiring use of liquid helium (4.2 K), have been known since 1911. However, it was not until somewhat recently that oxide-based high-temperature (high-$T_c$) superconductors have been discovered. Around 1986, a first high-temperature superconductor (HTS), having superconducting properties at a temperature above that of liquid nitrogen (77 K) was discovered, namely $YBa_2Cu_3O_{7-x}$ (YBCO), followed by development of additional materials over the past 15 years including $Bi_2Sr_2Ca_2Cu_3O_{10+y}$ (BSCCO), and others. The development of high-$T_c$ superconductors has created the potential of economically feasible development of superconductor components and other devices incorporating such materials, due partly to the cost of operating such superconductors with liquid nitrogen rather than the comparatively more expensive cryogenic infrastructure based on liquid helium.

Of the myriad of potential applications, the industry has sought to develop use of such materials in the power industry, including applications for power generation, transmission, distribution, and storage. In this regard, it is estimated that the inherent resistance of copper-based commercial power components is responsible for billions of dollars per year in losses of electricity, and accordingly, the power industry stands to gain based upon utilization of high-temperature superconductors in power components such as transmission and distribution power cables, generators, transformers, and fault current interrupters/limiters. In addition, other benefits of high-temperature superconductors in the power industry include a factor of 3-10 increase of power-handling capacity, significant reduction in the size (i.e., footprint) and weight of electric power equipment, reduced environmental impact, greater safety, and increased capacity over conventional technology. While such potential benefits of high-temperature superconductors remain quite compelling, numerous technical challenges continue to exist in the production and commercialization of high-temperature superconductors on a large scale.

Among the challenges associated with the commercialization of high-temperature superconductors, many exist around the fabrication of a superconducting tape segment that can be utilized for formation of various power components. A first generation of superconducting tape segment includes use of the above-mentioned BSCCO high-temperature superconductor. This material is generally provided in the form of discrete filaments, which are embedded in a matrix of noble metal, typically silver. Although such conductors may be made in extended lengths needed for implementation into the power industry (such as on the order of a kilometer), due to materials and manufacturing costs, such tapes do not represent a widespread commercially feasible product.

Accordingly, a great deal of interest has been generated in HTS tapes that have superior commercial viability. These tapes typically rely on a layered structure, generally including a flexible substrate that provides mechanical support, at least one buffer layer overlying the substrate, the buffer layer optionally containing multiple films, an HTS layer overlying the buffer film, and an optional capping layer overlying the superconductor layer, and/or an optional electrical stabilizer layer overlying the capping layer or around the entire structure. However, to date, numerous engineering and manufacturing challenges remain prior to full commercialization of such second generation tapes.

Accordingly, in view of the foregoing, various needs continue to exist in the art of superconductors, and in particular, provision of commercially viable superconducting tapes, methods of forming same, and power components utilizing such superconducting tapes. One of those needs is to have suitable joining technique to extend the total second-generation HTS tape length to that is required for practical application, to repair broken segments, and for other similar purposes.

SUMMARY

In an embodiment, a superconducting article can include a first stacked conductor segment including first and second superconductive segments and second stacked conductor segment including third and forth superconductive segments. The first stacked conductor segment can have a nominal thickness $t_{n1}$, and the second stacked conductor segment can have a nominal thickness $t_{n2}$. The superconducting article can further include a joint region comprising a first splice and a second splice. The first splice can connect the first and third superconductive segments together, and the second splice can connect the second and forth superconductive segments together. The first splice can be adjacent to and can overlap portions of both the first and third superconductive segments along at least a portion of the joint region, and the second splice can be adjacent to and can overlap portions of both the second and forth superconductive segments along at least a portion of the joint region. The joint region can have a thickness $t_{jr}$, wherein $t_{jr}$ is not greater than at least one of $1.8\, t_{n1}$ and $1.8\, t_{n2}$.

In another embodiment, a superconducting article can include a first superconductive segment and a second superconductive segment. The first superconductive segment can have a first substrate and a first superconducting layer overlying the first substrate, and the second superconductive segment can have a second substrate and a second superconducting layer overlying the second substrate. The superconducting article can further include a copper segment between the first and second superconductive segments. The first and second superconductive segments can be arranged such that the first and second superconducting layers are towards the copper segment.

In yet another embodiment, a method of forming a superconducting article can include providing first and second superconductive tapes. The first superconductive tape can include a first superconductive layer overlying a first substrate, and the second superconductive tape can include a second superconductive layer overlying a second substrate. The method can further include bonding the first superconductive tapes to a first major surface of a copper strip and the second superconductive tape to the second major surface of the copper strip. The first and second substrate tapes can be arranged with the first and second superconductive layers towards the copper strip and the first and second substrates away from the copper strip.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

Figure 1:
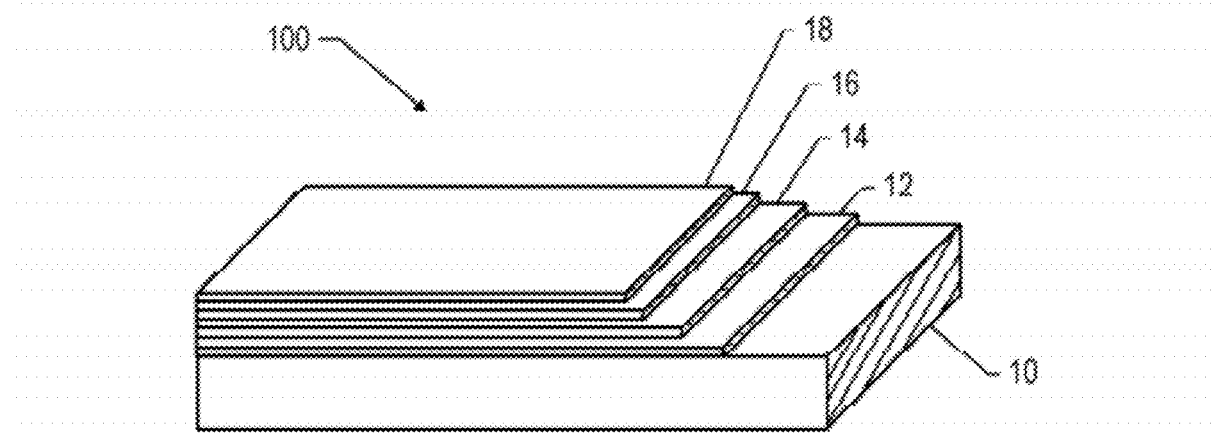
FIG. 1 illustrates a prospective view showing the generalized structure of a superconducting article according to an embodiment.

Turning to FIG. 1, the generalized layered structure of a superconducting article 100 according to an embodiment of the present invention is depicted. The superconducting article includes a substrate 10, a buffer layer 12 overlying the substrate 10, a superconducting layer 14, followed by a capping layer 16, typically a noble metal, and a stabilizer layer 18, typically a non-noble metal such as copper. The buffer layer 12 may consist of several distinct films. The stabilizer layer 18 may extend around the periphery of the superconducting article 100, thereby encasing it.

The substrate 10 is generally metal-based, and typically, an alloy of at least two metallic elements. Particularly suitable substrate materials include stainless steel alloys and nickel-based metal alloys such as the known Hastelloy® or Inconel® group of alloys. These alloys tend to have desirable creep, chemical and mechanical properties, including coefficient of expansion, tensile strength, yield strength, and elongation. These metals are generally commercially available in the form of spooled tapes, particularly suitable for superconducting tape fabrication, which typically will utilize reel-to-reel tape handling.

The substrate 10 is typically in a tape-like configuration, having a high dimension ratio. As used herein, the term 'dimension ratio' is used to denote the ratio of the length of the substrate or tape to the next longest dimension, the width of the substrate or tape. For example, the width of the tape is generally on the order of about 0.1 to about 10 cm, and the length of the tape is typically at least about 100 m, most typically greater than about 500 m. Indeed, superconducting tapes that include substrate 10 may have a length on the order of 1 km or above. Accordingly, the substrate may have a dimension ratio which is fairly high, on the order of not less than 10, not less than about $10^2$, or even not less than about $10^3$. Certain embodiments are longer, having a dimension ratio of $10^4$ and higher.

In one embodiment, the substrate is treated so as to have desirable surface properties for subsequent deposition of the constituent layers of the superconducting tape. For example, the surface may be polished to a desired flatness and surface roughness. Additionally, the substrate may be treated to be biaxially textured as is understood in the art, such as by the known RABiTS (roll assisted biaxially textured substrate) technique, although embodiments herein typically utilize a non-textured, polycrystalline substrate, such as commercially available nickel-based tapes noted above.

Turning to the buffer layer 12, the buffer layer may be a single layer, or more commonly, be made up of several films. Most typically, the buffer layer includes a biaxially textured film, having a crystalline texture that is generally aligned along crystal axes both in-plane and out-of-plane of the film. Such biaxial texturing may be accomplished by IBAD. As is understood in the art, IBAD is acronym that stands for ion beam assisted deposition, a technique that may be advantageously utilized to form a suitably textured buffer layer for subsequent formation of a superconducting layer having desirable crystallographic orientation for superior superconducting properties. Magnesium oxide is a typical material of choice for the IBAD film, and may be on the order of about 1 to about 500 nanometers, such as about 5 to about 50 nanometers. Generally, the IBAD film has a rock-salt like crystal structure, as defined and described in U.S. Pat. No. 6,190,752, incorporated herein by reference.

The buffer layer may include additional films, such as a barrier film provided to directly contact and be placed in between an IBAD film and the substrate. In this regard, the barrier film may advantageously be formed of an oxide, such as yttria, and functions to isolate the substrate from the IBAD film. A barrier film may also be formed of non-oxides such as silicon nitride. Suitable techniques for deposition of a barrier film include chemical vapor deposition and physical vapor deposition including sputtering. Typical thicknesses of the barrier film may be within a range of about 1 to about 200 nanometers. Still further, the buffer layer may also include an epitaxially grown film(s), formed over the IBAD film. In this context, the epitaxially grown film is effective to increase the thickness of the IBAD film, and may desirably be made principally of the same material utilized for the IBAD layer such as MgO or other compatible materials.

In embodiments utilizing an MgO-based IBAD film and/or epitaxial film, a lattice mismatch between the MgO material and the material of the superconducting layer exists. Accordingly, the buffer layer may further include another buffer film, this one in particular implemented to reduce a mismatch in lattice constants between the superconducting layer and the underlying IBAD film and/or epitaxial film. This buffer film may be formed of materials such as YSZ (yttria-stabilized zirconia), magnesia, ceria, gadolinium zirconium oxide, strontium ruthenate, lanthanum manganate, and generally, perovskite-structured ceramic materials. The buffer film may be deposited by various physical vapor deposition techniques.

While the foregoing has principally focused on implementation of a biaxially textured film in the buffer stack (layer) by a texturing process such as IBAD, alternatively, the substrate surface itself may be biaxially textured. In this case, the buffer layer is generally epitaxially grown on the textured substrate so as to preserve biaxial texturing in the buffer layer. One process for forming a biaxially textured substrate is the process known in the art as RABiTS (roll assisted biaxially textured substrates), generally understood in the art.

The superconducting layer 14 is generally in the form of a high-temperature superconductor (HTS) layer. HTS materials are typically chosen from any of the high-temperature superconducting materials that exhibit superconducting properties above the temperature of liquid nitrogen, 77K. Such materials may include, for example, $YBa_2Cu_3O_{7-x}$, $Bi_2Sr_2CaCu_2O_z$, $Bi_2Sr_2Ca_2Cu_3O_{10+y}$, $Tl_2Ba_2Ca_2Cu_3O_{10+y}$, and $HgBa_2Ca_2Cu_3O_{8+y}$. One class of materials includes $REBa_2Cu_3O_{7-x}$, wherein $0 \geq x > 1$ and RE is a rare earth or combination of rare earth elements. Of the foregoing, $YBa_2Cu_3O_{7-x}$, also generally referred to as YBCO, may be advantageously utilized. YBCO may be used with or without the addition of dopants, such as rare earth materials, for example samarium. The superconducting layer 14 may be formed by any one of various techniques, including thick and thin film forming techniques. Preferably, a thin film physical vapor deposition technique such as pulsed laser deposition (PLD) can be used for a high deposition rates, or a chemical vapor deposition technique can be used for lower cost and larger surface area treatment. Typically, the superconducting layer has a thickness on the order of about 0.1 to about 30 microns, most typically about 0.5 to about 20 microns, such as about 1 to about 5 microns, in order to get desirable amperage ratings associated with the superconducting layer 14.

The superconducting article may also include a capping layer 16 and a stabilizer layer 18, which are generally implemented to provide a low resistance interface and for electrical stabilization to aid in prevention of superconductor burnout in practical use. More particularly, layers 16 and 18 aid in continued flow of electrical charges along the superconductor in cases where cooling fails or the critical current density is exceeded, and the superconducting layer moves from the superconducting state and becomes resistive. Typically, a noble metal is utilized for capping layer 16 to prevent unwanted interaction between the stabilizer layer(s) and the superconducting layer 14. Typical noble metals include gold, silver, platinum, and palladium. Silver is typically used due to its cost and general accessibility. The capping layer 16 is typically made to be thick enough to prevent unwanted diffusion of the components used in the application of the stabilizer layer 18 into the superconducting layer 14, but is made to be generally thin for cost reasons (raw material and processing costs). Typical thicknesses of the capping layer 16 range within about 0.1 to about 10.0 microns, such as 0.5 to about 5.0 microns. Various techniques may be used for deposition of the capping layer 16, including physical vapor deposition, such as DC magnetron sputtering, as well as wet chemical processing such as electro-less plating, and electroplating.

The stabilizer layer 18 is generally incorporated to overlie the superconducting layer 14, and in particular, overlie and directly contact the capping layer 16 in the particular embodiment shown in FIG. 1. The stabilizer layer 18 functions as a protection/shunt layer to enhance stability against harsh environmental conditions and superconductivity quench. The layer is generally dense and thermally and electrically conductive, and functions to bypass electrical current in case of failure of the superconducting layer or if the critical current of the superconducting layer is exceeded. It may be formed by any one of various thick and thin film forming techniques, such as wet chemical processing, such as electro-less plating and electroplating, as well as physical vapor deposition, typically evaporation or sputtering. In this regard, the capping layer 16 may function as a seed layer for deposition of copper thereon. Typical thicknesses of the stabilizer layer 18 range from 0 to about 1000 microns, such as 5 to about 150 microns.

In order to adequately bypass electrical current in case of failure of the superconducting layer or if the critical current of the superconducting layer is exceeded, it can be necessary to increase the amount of non-noble metal electrically coupled to the stabilizer layer as the critical current of the superconducting article is increased.

Figure 2:
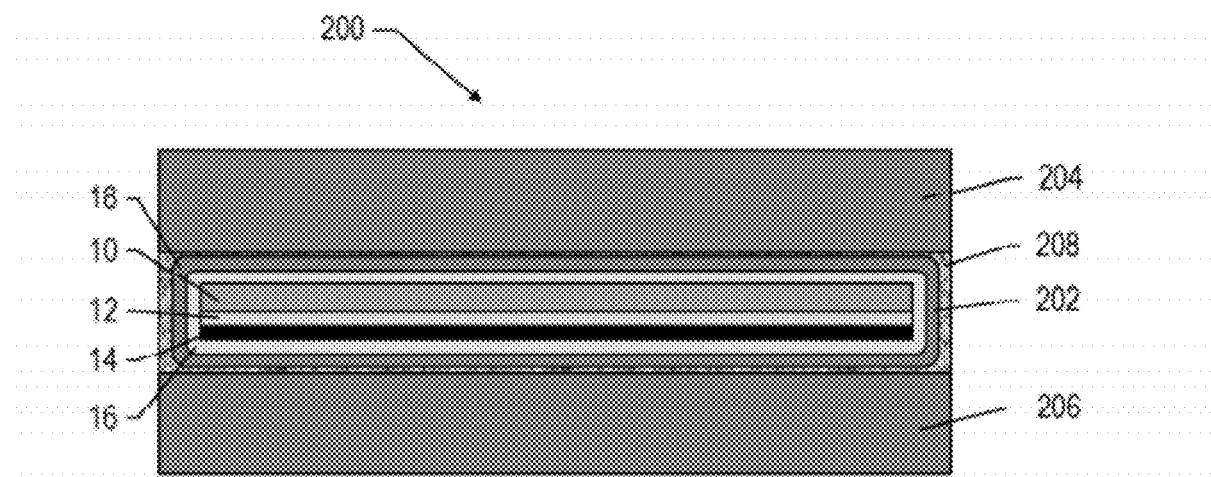
FIG. 2 is a cross section view showing a superconducting article according to an embodiment.

FIG. 2 illustrates a cross section of an exemplary superconductive article 200 wherein a superconducting tape 202 is embedded between bulk copper 204 and 206. Superconducting tape 202 can be similar to superconducting article 100. Here, similar reference numerals are utilized to denote analogous structural features. Description of the constituent layers is not repeated below; the reader is referred to the detailed description provided about with respect to the constituent layers of the superconductive article. Capping layer 16 can extend around the periphery of the combination of the substrate 10, the buffer layer 12, and the superconducting layer 14, thereby encasing the superconducting tape 202. Similarly, stabilizing layer 18 can extend around the periphery of the capping layer 16. In an embodiment, stabilizing layer 18 can be electrodeposited over the capping layer. When present, the stabilizing layer 18 can have a thickness in a range of about 2.5 microns to about 100 microns, such as about 5 microns to about 50 microns, even about 15 microns to about 15 microns.

Superconducting tape 202 can be bonded to bulk copper layers 204 and 206, such as by solder 208. For example, solder 208 can be an indium solder, a lead-tin solder, or a tin based solder. Bulk copper layers 204 and 206 can be in the form of copper strips that extend along the length of the superconductive article 200.

In an alternate embodiment, a bulk copper layer can be formed, such as by channeling, wrapping, or die forming, around superconducting tape 202. Further, an outer layer of electroplated copper may be applied to encase the entire structure including the superconducting tape 202 and the bulk copper layer.

Figure 3:
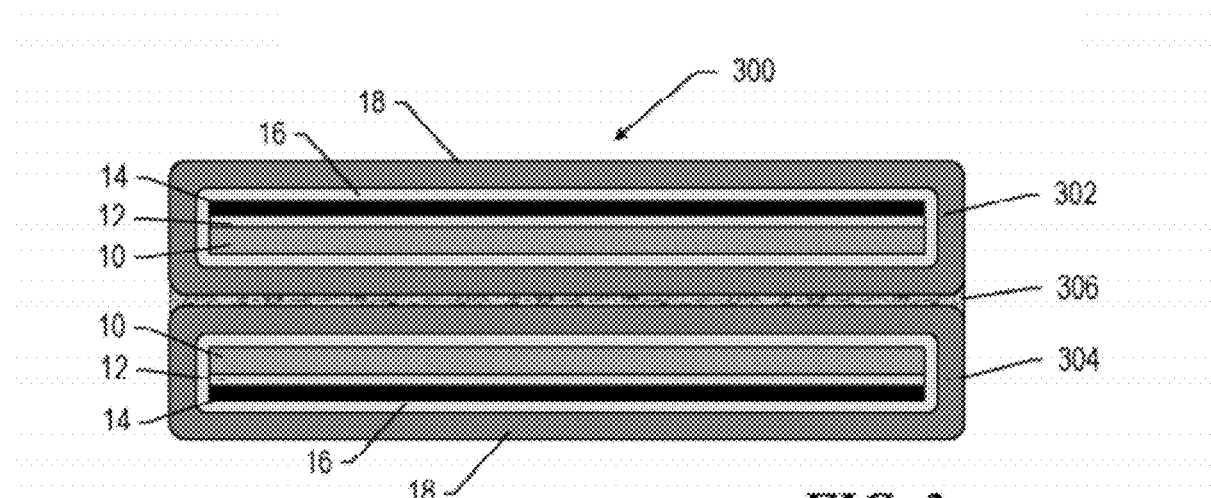
FIGS. 3 and 4 are cross section views showing stacked superconducting articles in a back-to-back configuration according to embodiments.

FIG. 3 illustrates a cross section of an exemplary stacked superconducting article 300. Stacked superconducting article 300 can include superconductive tapes 302 and 304. Superconducting tapes 302 and 304 can be similar to superconducting article 100. Superconductive tapes 302 and 304 can be joined using bonding layer 306. Bonding layer 306 can be a solder layer, such as an indium solder, a lead-tin solder, or a tin based solder. Superconductive tapes 302 and 304 can be arranged in a back-to-back configuration. In the back-to-back configuration, superconductive tapes 302 and 304 can be arranged with substrates 10 towards the interior of superconducting article 300 and superconducting layers 14 towards the exterior of superconducting article 300.

Figure 4:
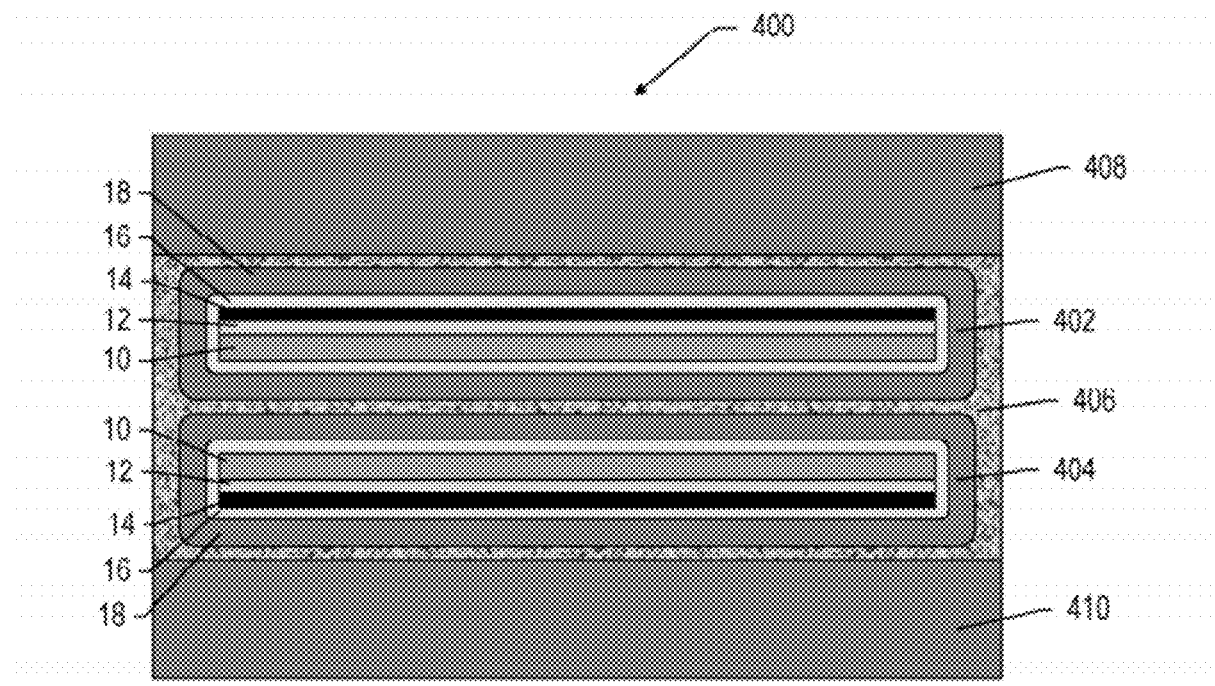

FIG. 4 illustrates another exemplary stacked superconducting article 400. Superconducting article 400 includes superconductive tapes 402 and 404 arranged in a back-to-back configuration, as described above with respect to FIG. 3. Superconductive tapes 402 and 404 are joined using bonding layer 406. Additionally, bulk copper layer 408 can be arranged adjacent to the superconductive face of superconductive tape 402 and bulk copper 410 can be arranged adjacent to the superconductive face of superconductive tape 404. Bulk copper 408 and 410 can be joined to superconductive tapes 402 and 404 by bonding layer 406.

Figure 5:
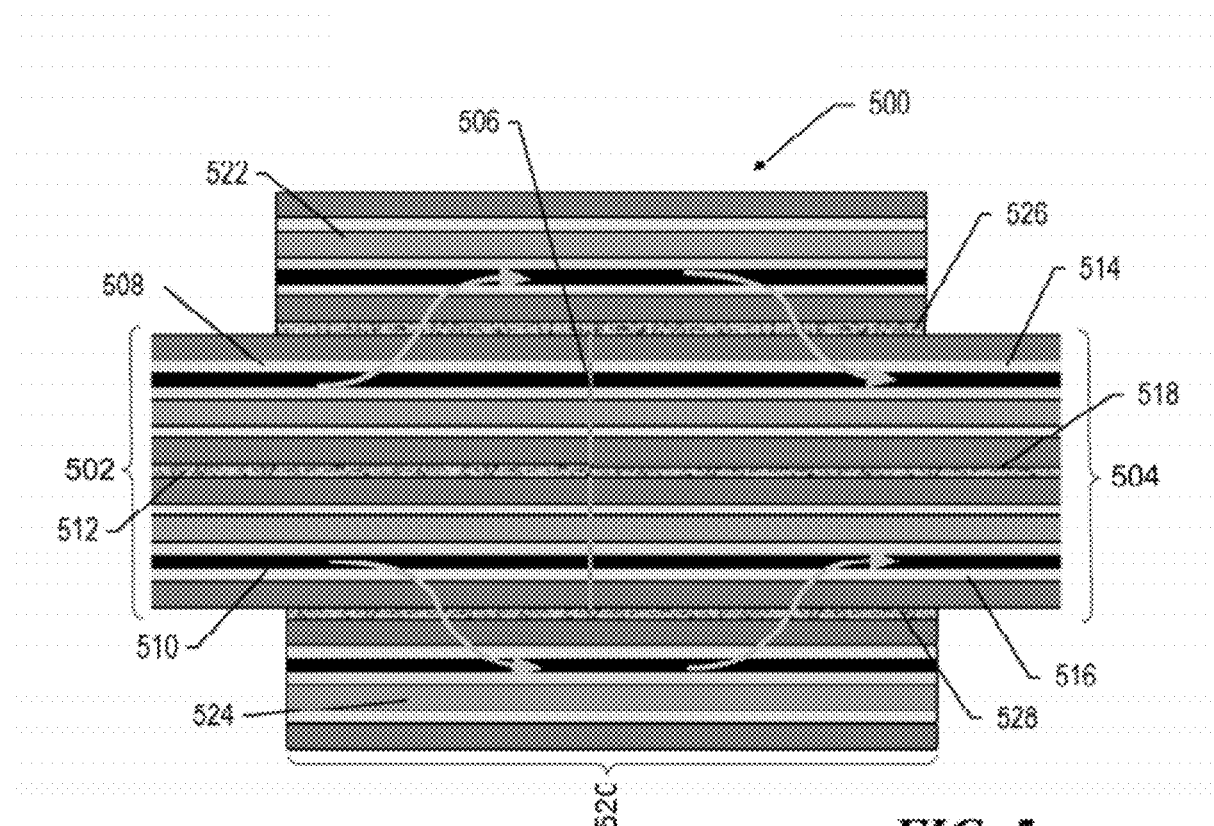
FIG. 5 is an illustration of an exemplary joint between stacked superconducting articles according to an embodiment.

FIG. 5 illustrates a region in which two stacked superconductive segments 502 and 504 are joined together to form a superconductive article 500 for joining back-to-back stacked superconducting articles. As shown, stacked superconductive segments 502 and 504 are positioned so as to be placed end-to-end. Particularly, the respective ends of stacked superconductive segments 502 and 504 are positioned to be in general abutting or near-abutting contact at an interface 506. Stacked superconductive segment 502 can include superconductive tapes 508 and 510 arranged in a back-to-back configuration. Superconductive tapes 508 and 510 can be held together with bonding layer 512. Similarly, stacked superconducting article 504 can include superconductive tapes 514 and 516 arranged in a back-to-back configuration and held together with bonding layer 518.

According to a particular feature of the embodiment shown in FIG. 5, the superconductive tapes 508 and 514 are electrically and mechanically joined together along a joint region 520. A splice 522 is provided spanning the joint region 520 to provide electrical and mechanical connectivity between the superconductive tapes 508 and 514. Similarly, superconductive tapes 510 and 516 are electrically and mechanically joined together along joint region 520. A splice 524 is provided spanning the joint region 520 to provide electrical and mechanical connectivity between the superconductive tapes 510 and 516. In the particular embodiment shown in FIG. 5, splices 522 and 524 each include a layered superconductive structure, generally inverted with respect to the layered structure of the respective superconductive tapes. More particularly, splices 522 and 524 may be fabricated according to the basic process flow for forming the superconductive tape, and cut into appropriate lengths.

Splice 522 is bonded to superconductive tapes 508 and 514 through use of a bond layer 526. Similarly, splice 524 is bonded to superconductive tapes 510 and 516 through use of a bond layer 528. Typically, the bond layers 526 and 528 are formed of a solder, such as an Indium solder, a lead-tin solder, or a tin based solder.

In an embodiment, splice 522 is a superconductive tape that is soldered face-to-face with superconductive tapes 508 and 514. Electrical current can flow from the superconductive layer of superconductive tape 508, to the stabilizer layer of superconductive tape 508, to the bond layer 526, to the stabilizer layer of splice 522, and to the superconductive layer of splice 522. Electrical current can then flow back through the stabilizer layer of splice 522, to the bond layer 526, to the stabilizer layer of superconductive tape 514, then finally to the superconductive layer of superconductive tape 514. Similarly, splice 524 is a superconductive tape that is soldered face-to-face with superconductive tapes 510 and 516. Electrical current can flow from the superconductive layer of superconductive tape 510, to the stabilizer layer of superconductive tape 510, to the bond layer 528, to the stabilizer layer of splice 524, and to the superconductive layer of splice 524. Electrical current can then flow back through the stabilizer layer of splice 524, to the bond layer 528, to the stabilizer layer of superconductive tape 516, then finally to the superconductive layer of superconductive tape 516.

According to embodiments described herein, the splice generally incorporates a superconductive layer. This particular aspect helps ensure a desirably low joint resistance. Particularly, according to embodiments herein, the superconductive article incorporating joint structures such as described herein have a joint resistance not greater than about 100 nano-ohms cm$^2$, such as not greater than about 50 nano-ohms cm$^2$, or even not greater than 25 nano-ohms cm$^2$. Additionally, joint resistance may be quantified in terms of heat dissipated, with an upper limit of not greater than 0.005 W cm$^2$ cm per joint, such as not greater than 0.0025 W cm$^2$ per joint.

Figure 6:
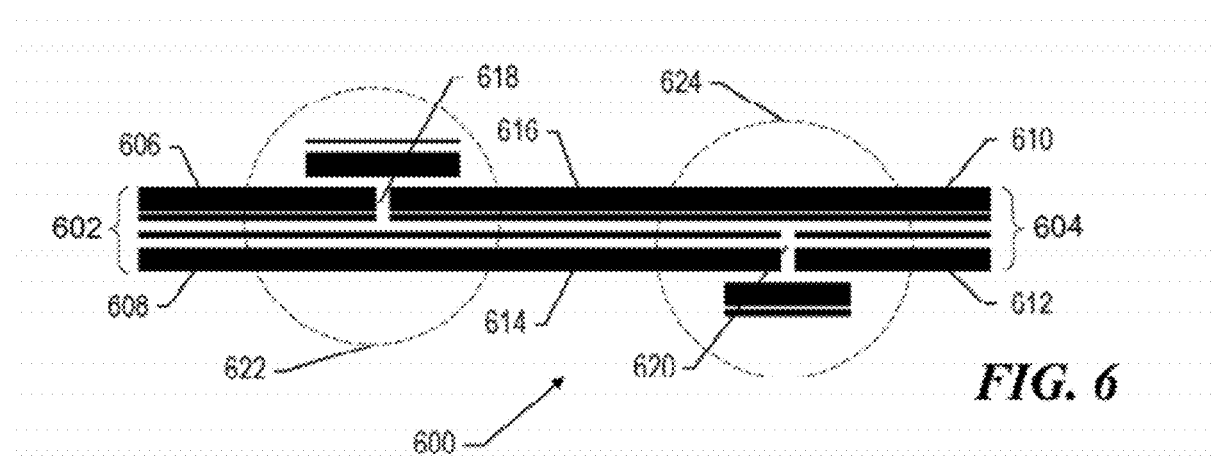
FIG. 6 is a schematic diagram illustrating of another exemplary joint between stacked superconducting articles according to an embodiment.

FIG. 6 illustrates an alternated joint structure in which two stacked superconductive segments 602 and 604 are joined together to form a superconductive article 600. Stacked superconductive segment 602 can include superconductive tapes 606 and 608 arranged in a back-to-back configuration. Similarly, stacked superconducting article 604 can include superconductive tapes 610 and 612 arranged in a back-to-back configuration. As shown, stacked superconductive segments 602 and 604 are positioned so as to be placed end-to-end in an offset manner. Particularly, stacked superconductive segment 602 can have an overhang region 614 where superconductive tape 608 extends past the end of superconductive tape 606. Similarly, stacked superconductive segment 604 can have an overhang region 616 where superconductive tape 610 extends past the end of superconductive tape 612. Overhang regions 614 and 616 can overlap allowing respective ends of superconductive tapes 606 and 610 to be in general abutting or near-abutting contact at an interface 618. Similarly, respective ends of superconductive tapes 608 and 612 can be in general abutting or near-abutting contact at an interface 620, with interface 620 offset from interface 618 along the length of superconductive article 600. Joint regions 622 and 624 are shown in more detail in FIGS. 7 and 8.

Figure 7:
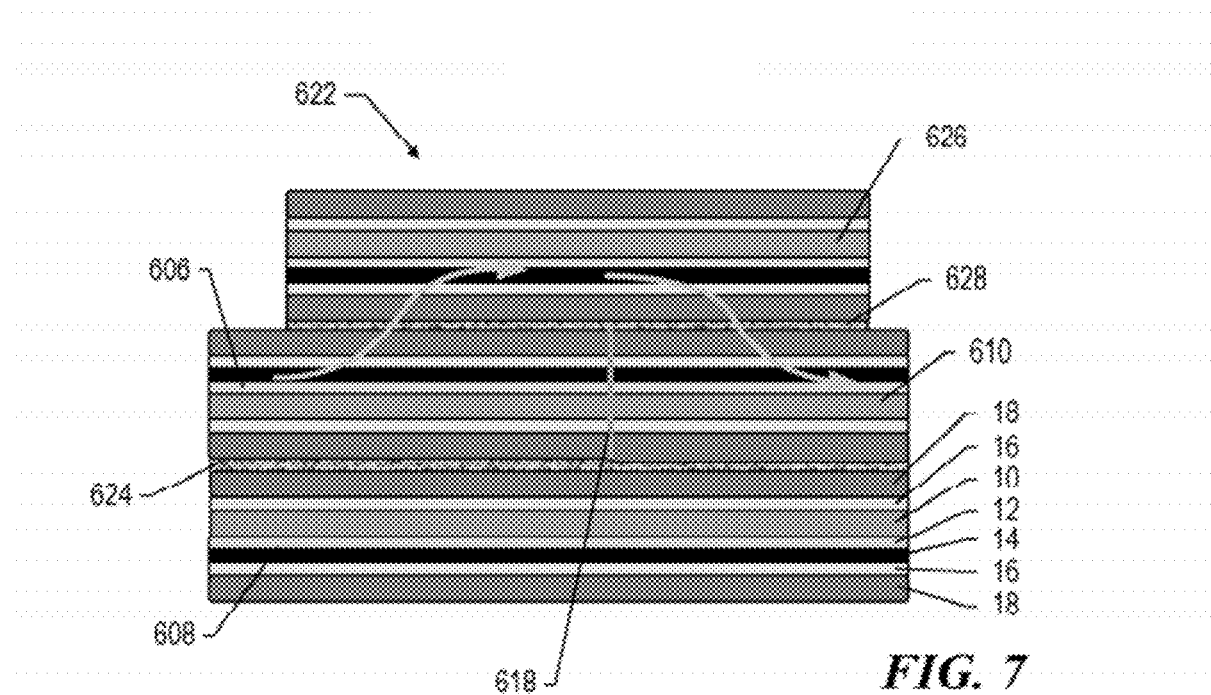
FIGS. 7 and 8 are enlarged views of portions of FIG. 6.

FIG. 7 provides a detailed view of joint region 622. Respective ends of superconductive tapes 606 and 610 can be arranged in general abutting or near-abutting contact at an interface 618. Superconductive tape 608 can extend past the end of superconductive tape 606 and overlap at least a portion of superconductive tape 610 in a back-to-back configuration. Bonding layer 624 can bond superconductive tape 608 to both superconductive tape 606 and superconductive tape 610.

Superconductive tapes 606 and 610 can be electrically and mechanically joined together along a joint region 622. A splice 626 is provided spanning the joint region 622 to provide electrical and mechanical connectivity between the superconductive tapes 606 and 608. Splice 626 can include a layered superconductive structure, generally inverted with respect to the layered structure of superconductive tapes 606 and 610. Splice 626 can be bonded to superconductive tapes 606 and 610 through use of a bond layer 628.

In an embodiment, splice 626 is a superconductive tape that is soldered face-to-face with superconductive tapes 606 and 610. Electrical current can flow from the superconductive layer of superconductive tape 606, to the stabilizer layer of superconductive tape 606, to the bond layer 628, to the stabilizer layer of splice 626, and to the superconductive layer of splice 626. Electrical current can then flow back through the stabilizer layer of splice 626, to the bond layer 628, to the stabilizer layer of superconductive tape 610, then finally to the superconductive layer of superconductive tape 610.

Figure 8:
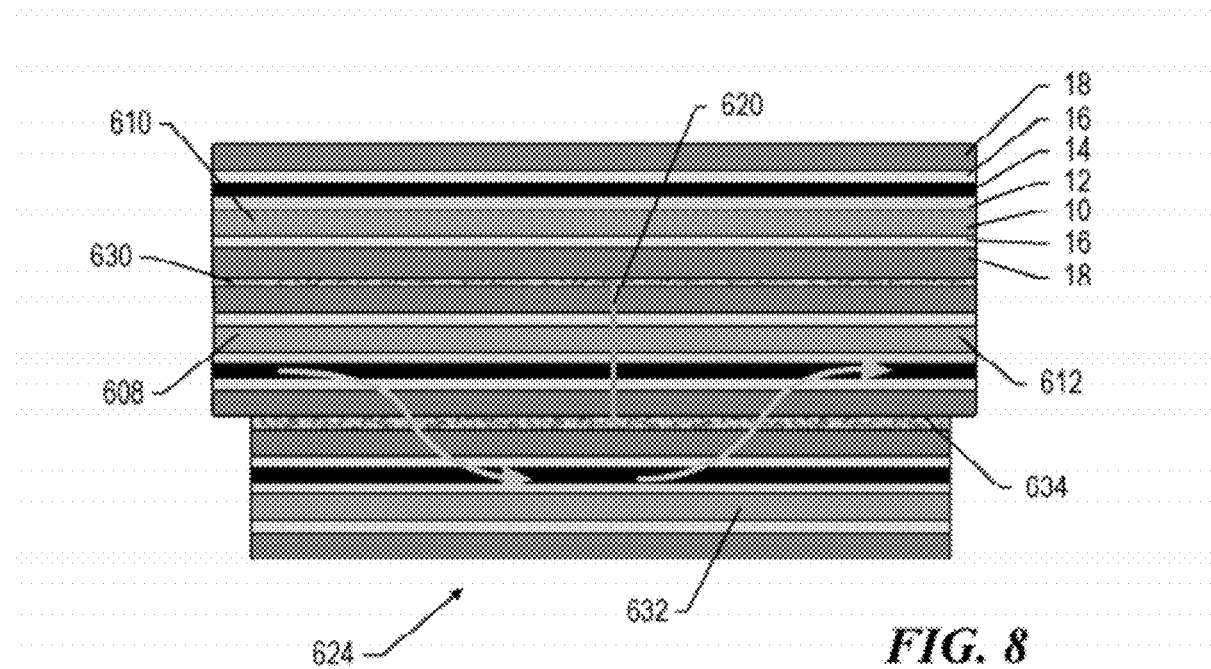

FIG. 8 provides a detailed view of joint region 624. Respective ends of superconductive tapes 608 and 612 can be arranged in general abutting or near-abutting contact at an interface 620. Superconductive tape 610 can extend past the end of superconductive tape 612 and overlap at least a portion of superconductive tape 608 in a back-to-back configuration. Bonding layer 630 can bond superconductive tape 610 to both superconductive tape 606 and superconductive tape 612.

Superconductive tapes 608 and 612 can be electrically and mechanically joined together along a joint region 624. A splice 632 is provided spanning the joint region 624 to provide electrical and mechanical connectivity between the superconductive tapes 608 and 612. Splice 632 can include a layered superconductive structure, generally inverted with respect to the layered structure of superconductive tapes 608 and 612. Splice 632 can be bonded to superconductive tapes 608 and 612 through use of a bond layer 634.

In an embodiment, splice 624 is a superconductive tape that is soldered face-to-face with superconductive tapes 608 and 612. Electrical current can flow from the superconductive layer of superconductive tape 608, to the stabilizer layer of superconductive tape 608, to the bond layer 634, to the stabilizer layer of splice 624, and to the superconductive layer of splice 624. Electrical current can then flow back through the stabilizer layer of splice 624, to the bond layer 634, to the stabilizer layer of superconductive tape 612, then finally to the superconductive layer of superconductive tape 612.

In reference to FIG. 6, stacked superconductive segments 602 and 604 each can have a nominal thickness $t_{n1}$ and $t_{n2}$, respectively. These nominal thicknesses correspond to the thickness of the respective segments along the majority of the length of the segments, particularly excluding the overhang regions 614 and 616.

Offset joint regions 622 and 624 can enable formation of relatively low-profile joint. In more detail, referring particularly to FIG. 6, joint region 622 has a thickness $t_{jr1}$ and joint region 624 has a thickness $t_{jr2}$. Generally, the thickness of the joint region $t_{jr1}$ is not greater than at least one of 1.8 $t_{n1}$ and 1.8 $t_{n2}$ and the thickness of the joint region $t_{jr2}$ is not greater than at least one of 1.8 $t_{n1}$ and 1.8 $t_{n2}$. Oftentimes the profile of each joint region is not greater than about 1.6 $t_{n1}$ or 1.6 $t_{n2}$. Further, the thickness of the joint region may be further reduced, such as not greater than at least one of 1.5 $t_{n1}$ and 1.5 $t_{n2}$, or not greater than at least one of 1.3 $t_{n1}$ and 1.3 $t_{n2}$. According to one embodiment, the joint thickness is substantially equal to the nominal thickness of at least one of the superconductive segments. While not illustrated in the drawings, the thickness of the joint region may be below that of one of or both the thicknesses of the superconductive segments.

Figure 9:
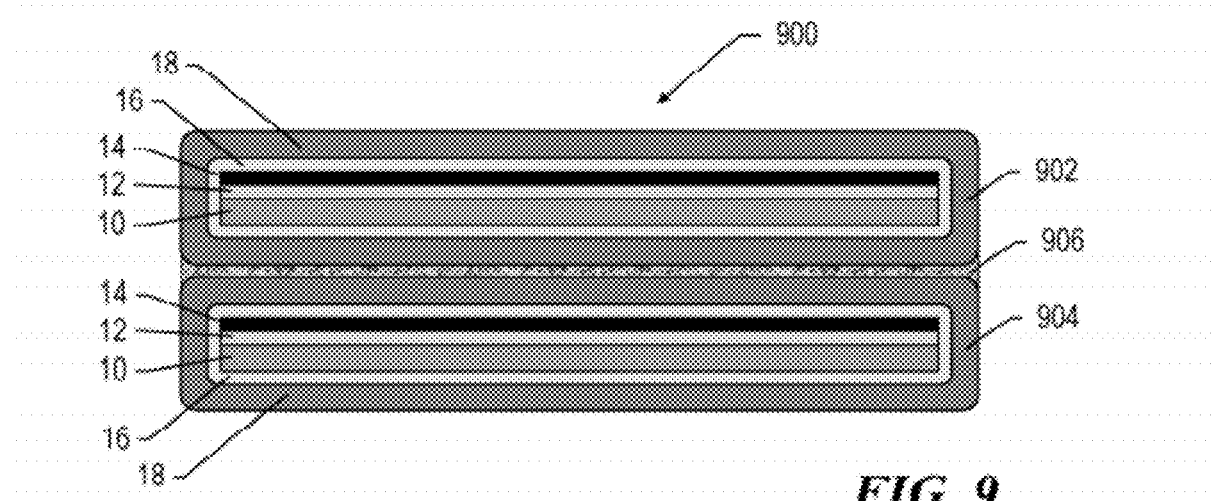
FIG. 9 is a cross section view illustrating stacked superconducting articles in a front-to-back configuration according to embodiments.

FIG. 9 illustrates a cross section of an exemplary stacked superconducting article 900. Stacked superconducting article 900 can include superconductive tapes 902 and 904. Superconducting tapes 902 and 904 can be similar to superconducting article 100. Superconductive tapes 902 and 904 can be joined using bonding layer 906. Bonding layer 906 can be a solder layer, such as an indium solder, a lead-tin solder, or a tin based solder. Superconductive tapes 902 and 904 can be arranged in a front-to-back configuration. In the front-to-back configuration, superconductive tape 902 can be arranged with substrate 10 towards the interior of superconducting article 900 and superconducting layers 14 towards the exterior of superconducting article 900, while superconductive tape 904 can be arranged with substrate 10 towards the exterior of superconducting article 900 and superconducting layers 14 towards the interior of superconducting article 900.

Figure 10:
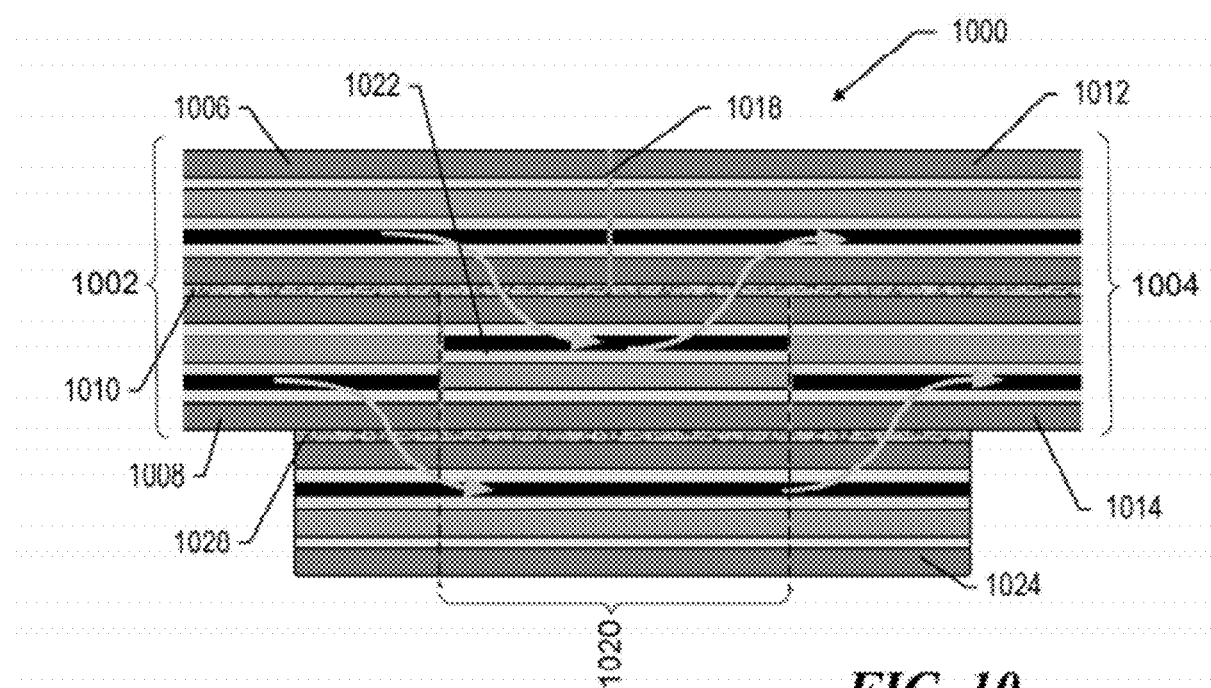
FIGS. 10 and 11 are illustrations of exemplary joints between stacked superconducting articles according to an embodiment.

FIG. 10 illustrates a region in which two stacked superconductive segments 1002 and 1004 are joined together to form a superconductive article 1000. Stacked superconductive segment 1002 can include superconductive tapes 1006 and 1008 arranged in a front-to-back configuration. Superconductive tapes 1006 and 1008 can be held together with bonding layer 1010. Similarly, stacked superconducting article 1004 can include superconductive tapes 1012 and 1014 arranged in a front-to-back configuration and held together with bonding layer 1010. As shown, stacked superconductive segments 1002 and 1004 are positioned so as to be placed end-to-end. Particularly, superconductive tapes 1006 and 1012 can be positioned to be in generally abutting or near abutting contact at interface 1018. Additionally, superconductive tapes 1008 and 1014 can be positioned in general alignment and separated by a gap 1020.

According to a particular feature of the embodiment shown in FIG. 10, the superconductive tapes 1006 and 1012 are electrically and mechanically joined together. A splice 1022 can be provided within the gap 1020 and overlapping with end portions of each of tapes 1006 and 1012 to provide electrical and mechanical connectivity between the superconductive tapes 1006 and 1012. Similarly, superconductive tapes 1008 and 1014 are electrically and mechanically joined together. A splice 1024 is provided spanning the gap 1020 and overlapping with end portions of each of tapes 1008 and 1014 to provide electrical and mechanical connectivity between the superconductive tapes 1008 and 1014. In the particular embodiment shown in FIG. 10, splices 1022 and 1024 each include a layered superconductive structure, generally inverted with respect to the layered structure of the respective superconductive tapes.

Splice 1022 is bonded to superconductive tapes 1006 and 1012 through use of a bond layer 1010. Similarly, splice 1024 is bonded to superconductive tapes 1008 and 1014 through use of a bond layer 1028. Typically, the bond layers 1010 and 1028 are formed of a solder, such as an Indium solder, a lead-tin solder, or a tin based solder.

In an embodiment, splice 1022 is a superconductive tape that is soldered face-to-face with superconductive tapes 1006 and 1012. Electrical current can flow from the superconductive layer of superconductive tape 1006, to the stabilizer layer of superconductive tape 1006, to the bond layer 1010, to the stabilizer layer of splice 1022, and to the superconductive layer of splice 1022. Electrical current can then flow back through the stabilizer layer of splice 1022, to the bond layer 1010, to the stabilizer layer of superconductive tape 1012, then finally to the superconductive layer of superconductive tape 1012. Similarly, splice 1024 is a superconductive tape that is soldered face-to-face with superconductive tapes 1008 and 1014. Electrical current can flow from the superconductive layer of superconductive tape 1008, to the stabilizer layer of superconductive tape 1008, to the bond layer 1028, to the stabilizer layer of splice 1024, and to the superconductive layer of splice 1024. Electrical current can then flow back through the stabilizer layer of splice 1024, to the bond layer 1028, to the stabilizer layer of superconductive tape 1014, then finally to the superconductive layer of superconductive tape 1014.

Figure 11:
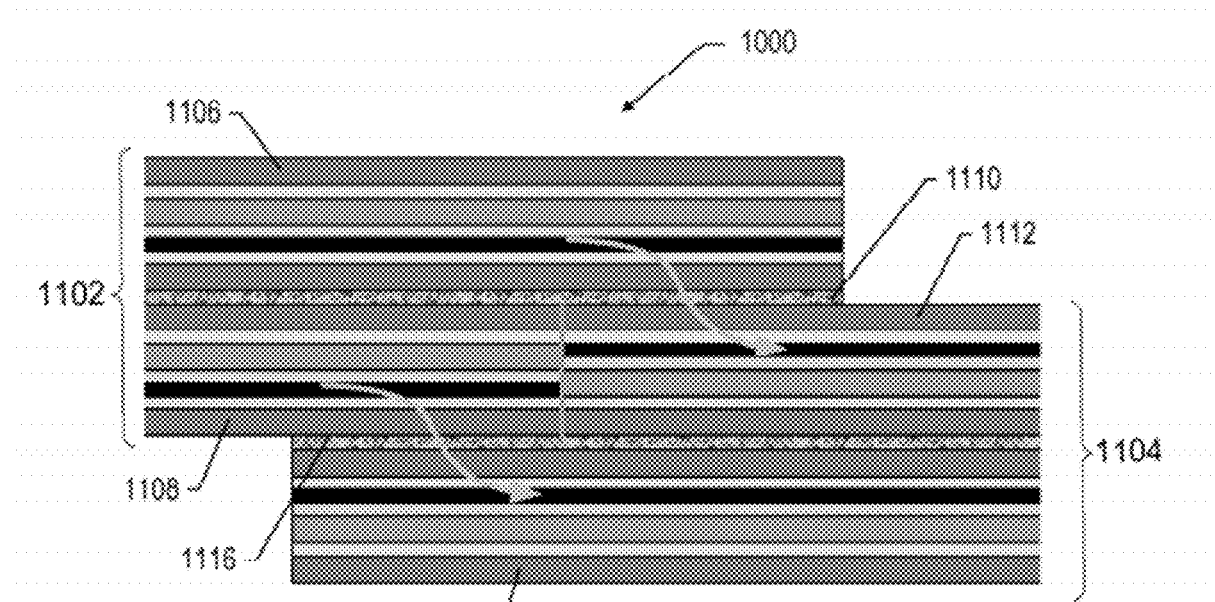

FIG. 11 illustrates a region in which two stacked superconductive segments 1102 and 1104 are joined together to form a superconductive article 1100 for joining front-to-back stacked superconducting articles. Stacked superconductive segment 1102 can include superconductive tapes 1106 and 1108 arranged in a front-to-back configuration. Superconductive tapes 1106 and 1108 can be held together with bonding layer 1110. The end of stacked superconductive segment 1102 can be offset such that a portion of superconductive tape 1106 extends beyond the end of 1108. Similarly, stacked superconducting article 1104 can include superconductive tapes 1112 and 1114 arranged in a back-to-back configuration and held together with bonding layer 1116. Additionally, a portion of superconductive tape 1114 can extend beyond the end of superconductive tape 1112.

As shown, stacked superconductive segments 1102 and 1104 can be inverted with respect to one another. Additionally, stacked superconductive segments 1102 and 1104 can be positioned so that superconductive tapes 1106 and 1112 partially overlap and superconductive tapes 1108 and 1114 partially overlap. Superconductive tapes 1108 and 1112 can be positioned to be in general abutting or near-abutting contact at an interface 1118. According to a particular feature of the embodiment shown in FIG. 11, the superconductive tapes 1106 and 1112 can be electrically and mechanically joined together by bonding layer 1110. Similarly, superconductive tapes 1108 and 1114 can be electrically and mechanically joined together by bonding layer 1116.

In an embodiment, electrical current can flow from the superconductive layer of superconductive tape 1106, to the stabilizer layer of superconductive tape 1106, to the bond layer 1110, to the stabilizer layer of superconductive tape 1112, then finally to the superconductive layer of superconductive tape 1112. Similarly, electrical current can flow from the superconductive layer of superconductive tape 1108, to the stabilizer layer of superconductive tape 1108, to the bond layer 1116, to the stabilizer layer of superconductive tape 1114, then finally to the superconductive layer of superconductive tape 1114.

Figure 12:
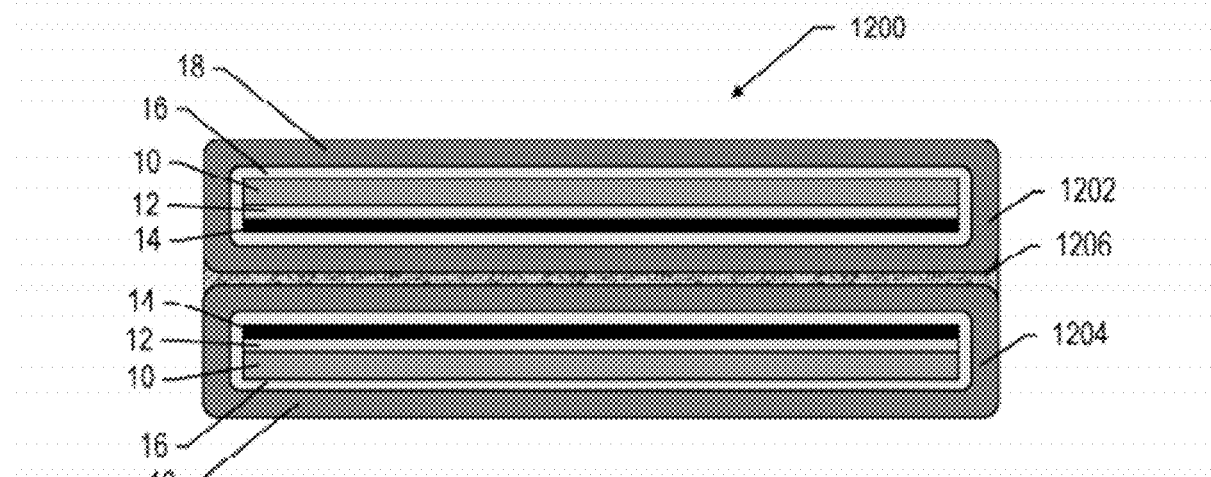
FIGS. 12 and 13 are cross section views illustrating stacked superconducting articles in a face-to-face configuration according to embodiments.

FIG. 12 illustrates a cross section of an exemplary stacked superconducting article 1200. Stacked superconducting article 1200 can include superconductive tapes 1202 and 1204. Superconducting tapes 1202 and 1204 can be similar to superconducting article 100. Superconductive tapes 1202 and 1204 can be joined using bonding layer 1206. Bonding layer 1206 can be a solder layer, such as an indium solder, a lead-tin solder, or a tin based solder. Superconductive tapes 1202 and 1204 can be arranged in a face-to-face configuration. In the face-to-face configuration, superconductive tapes 1202 and 1204 can be arranged with substrates 10 towards the exterior of superconducting article 1200 and superconducting layers 14 towards the interior of superconducting article 1200.

Figure 13:
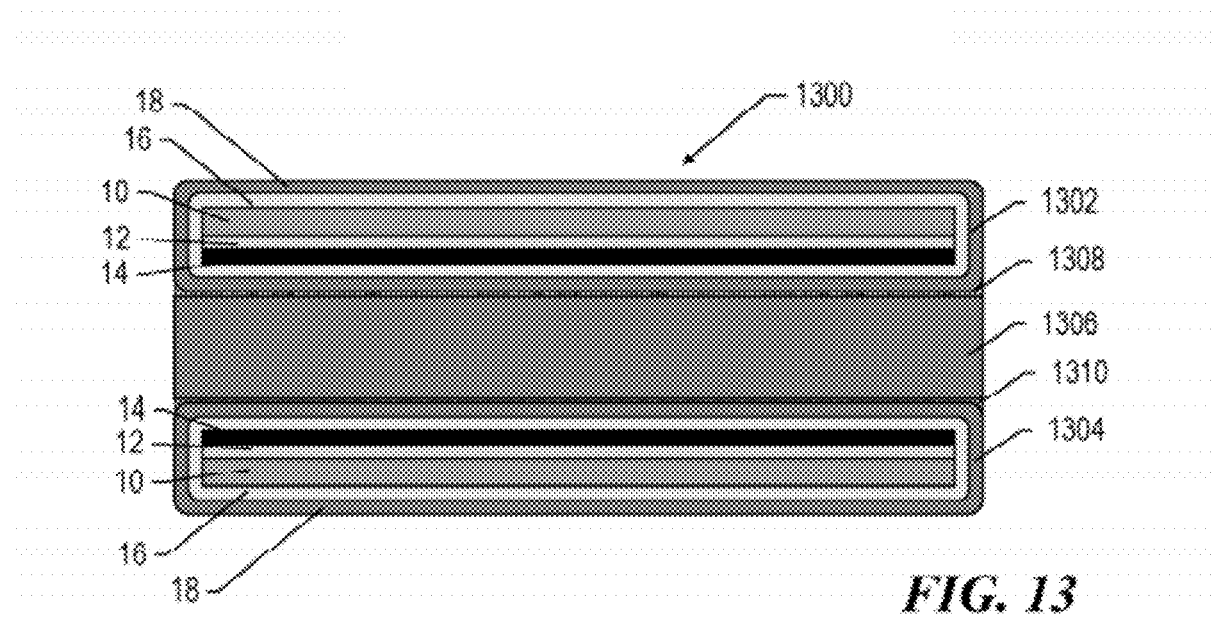

FIG. 13 illustrates another exemplary stacked superconducting article 1300. Superconducting article 1300 includes superconductive tapes 1302 and 1304 arranged in a face-to-face configuration, as described above with respect to FIG. 12. Additionally, bulk copper layer 1306 can be arranged between superconductive tapes 1302 and 1304. Superconductive tape 1302 can be joined to a first side of bulk copper layer 1306 by bonding layer 1308 and superconductive tape 1304 can be joined to a second side of bulk copper layer 1306 by bonding layer 1310. In such a stacked conductor structure, current can be shared between the two superconducting layers and the stabilizer. Normal state resistance and conductor mass per unit length, which are important contributors to the level of stabilization, can be engineered by adjusting the thickness and the resistivity of the bulk copper layer. In an embodiment, the thickness of the bulk copper layer can be at least about 25 microns, such as at least about 50 microns, even at least about 75 microns. Additionally, the thickness of the stabilization layer 18 can range from about 2.5 microns to about 100 microns, such as about 5 microns to about 50 microns, even about 15 microns to about 25 microns.

Figure 14:
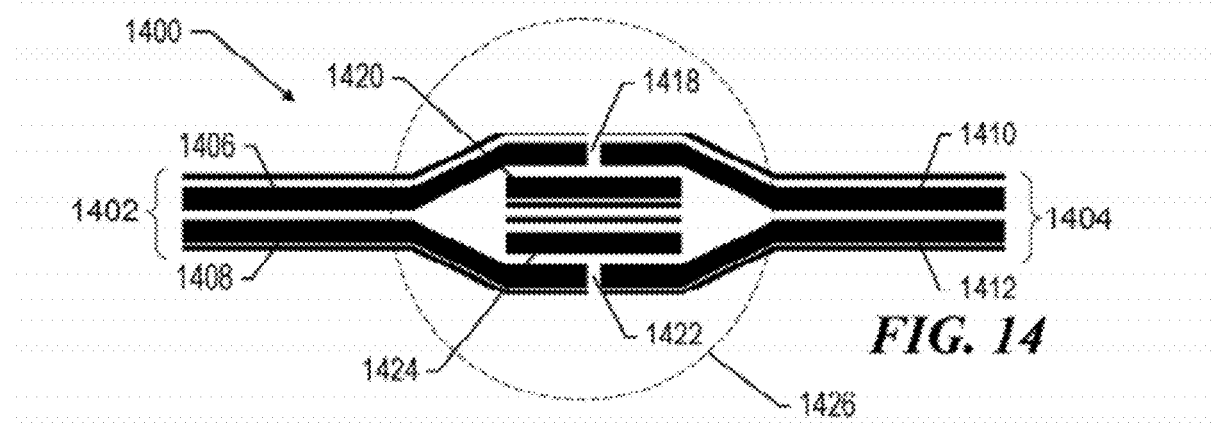
FIG. 14 is a schematic diagram illustrating of another exemplary joint between stacked superconducting articles according to an embodiment.

FIG. 14 illustrates an exemplary joint structure in which two stacked superconductive segments 1402 and 1404 are joined together to form a superconductive article 1400. Stacked superconductive segment 1402 can include superconductive tapes 1406 and 1408 arranged in a face-to-face configuration. Similarly, stacked superconducting article 1404 can include superconductive tapes 1410 and 1412 arranged in a face-to-face configuration. As shown, stacked superconductive segments 1402 and 1404 are arranged end-to-end. Particularly, superconductive tapes 1406 and 1408 are separated at an end of stacked superconductive segment 1402, and superconductive tapes 1410 and 1412 are separated at an end of stacked superconductive segment 1404. The respective ends of superconductive tapes 1406 and 1410 and superconductive tapes 1408 and 1412 are positioned to be in general abutting or near-abutting contact at interfaces 1418 and 1422 respectively. Additionally, superconductive tapes 1406 and 1410 can be electrically and mechanically joined together along a joint region 1426. A splice 1420 is provided spanning the interface 1418 to provide electrical and mechanical connectivity between the superconductive tapes 1406 and 1410. Similarly, superconductive tapes 1408 and 1412 can be electrically and mechanically joined together along joint region 1426. A splice 1424 is provided spanning the interface 1422 to provide electrical and mechanical connectivity between the superconductive tapes 1408 and 1412. Joint region 1426 is shown in more detail in FIG. 15.

Figure 15:
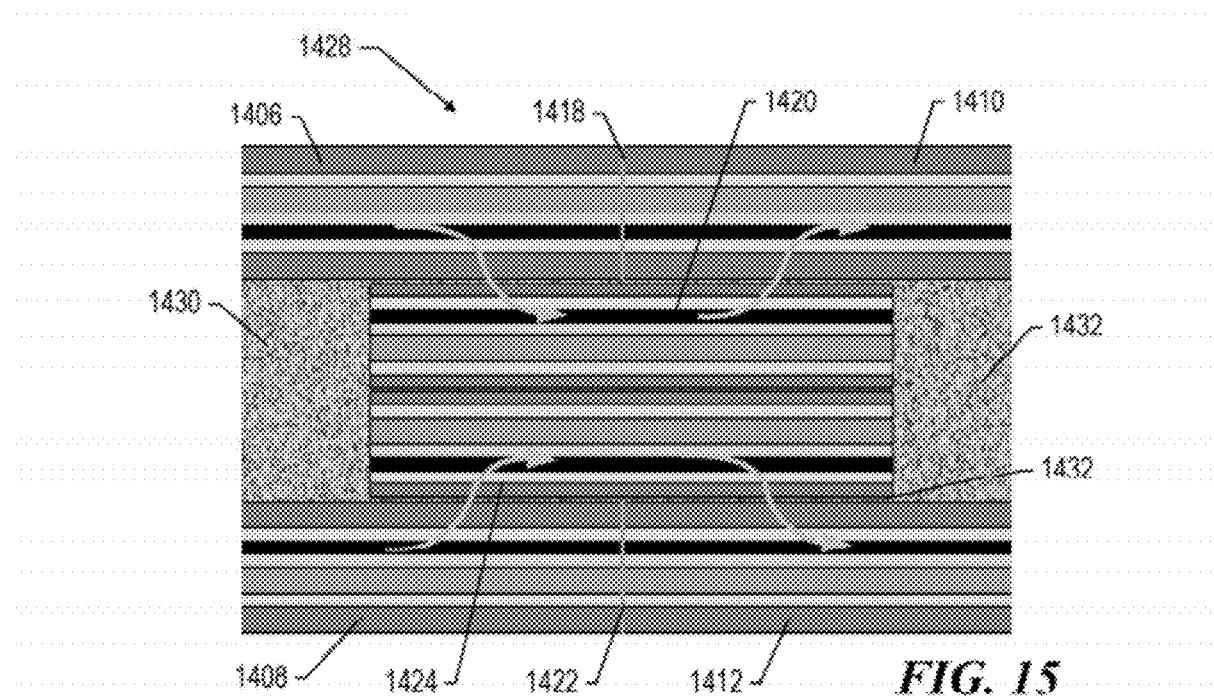
FIG. 15 is an enlarged view of portions of FIG. 14.

FIG. 15 provides a detailed view of joint region 1428. Respective ends of superconductive tapes 1406 and 1410 can be arranged in general abutting or near-abutting contact at an interface 1418. Splice 1420 can span the interface 1418 to provide electrical and mechanical connectivity between the superconductive tapes 1406 and 1410. Bonding layer 1424 can bond splice 1420 to superconductive tapes 1406 and 1410. Similarly, respective ends of superconductive tapes 1408 and 1412 can be arranged in general abutting or near-abutting contact at an interface 1422. Splice 1424 can span the interface 1422 to provide electrical and mechanical connectivity between the superconductive tapes 1408 and 1412. Bonding layer 1426 can bond splice 1422 to superconductive tapes 1408 and 1412. Additionally, the space 1430 between superconductive tapes 1406 and 1408 and the space 1432 between superconductive tapes 1410 and 1412 can be filled, such as with the material of bonding layers 1424 and 1426.

In an embodiment, splice 1420 is a superconductive tape that is soldered face-to-face with superconductive tapes 1406 and 1410. Electrical current can flow from the superconductive layer of superconductive tape 1406, to the stabilizer layer of superconductive tape 1406, to the bond layer 1424, to the stabilizer layer of splice 1420, and to the superconductive layer of splice 1420. Electrical current can then flow back through the stabilizer layer of splice 1420, to the bond layer 1424, to the stabilizer layer of superconductive tape 1410, then finally to the superconductive layer of superconductive tape 1410. Similarly, splice 1424 is a superconductive tape that is soldered face-to-face with superconductive tapes 1408 and 1412. Electrical current can flow from the superconductive layer of superconductive tape 1408, to the stabilizer layer of superconductive tape 1408, to the bond layer 1426, to the stabilizer layer of splice 1424, and to the superconductive layer of splice 1424. Electrical current can then flow back through the stabilizer layer of splice 1424, to the bond layer 1426, to the stabilizer layer of superconductive tape 1412, then finally to the superconductive layer of superconductive tape 1412.

Figure 16:
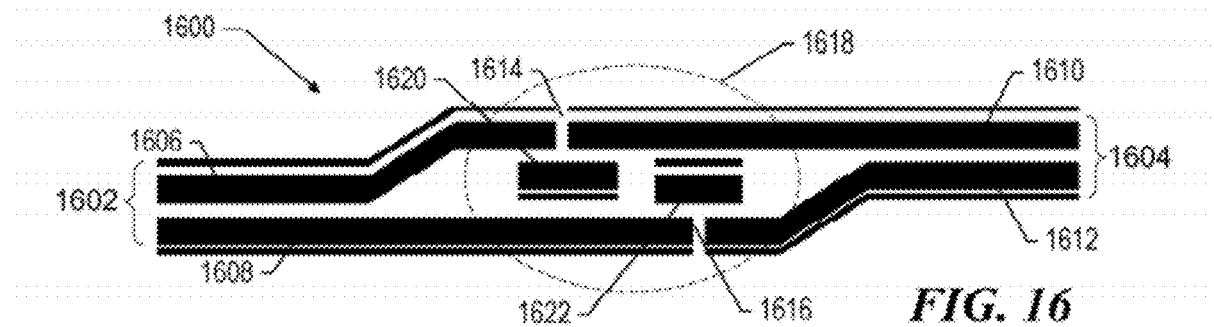
FIG. 16 is a schematic diagram illustrating of another exemplary joint between stacked superconducting articles according to an embodiment.

FIG. 16 illustrates an alternate joint structure in which two stacked superconductive segments 1602 and 1604 are joined together to form a superconductive article 1600. Stacked superconductive segment 1602 can include superconductive tapes 1606 and 1608 arranged in a face-to-face configuration with a portion of superconductive tape 1608 extending beyond the end of superconductive tape 1606. Similarly, stacked superconducting article 1604 can include superconductive tapes 1610 and 1612 arranged in a face-to-face configuration with a portion of superconductive tape 1610 extending beyond the end of superconductive tape 1612. As shown, stacked superconductive segments 1602 and 1604 are arranged end-to-end. Particularly, superconductive tapes 1606 and 1608 are separated at an end of stacked superconductive segment 1602, and superconductive tapes 1610 and 1612 are separated at an end of stacked superconductive segment 1604. The respective ends of superconductive tapes 1606 and 1610 and superconductive tapes 1608 and 1612 are positioned to be in general abutting or near-abutting contact at interfaces 1614 and 1616 respectively. Interfaces 1614 and 1616 can be offset from one another along the length of superconductive article 1600. Additionally, superconductive tapes 1606 and 1610 can be electrically and mechanically joined together along a joint region 1618. A splice 1620 is provided spanning the interface 1614 to provide electrical and mechanical connectivity between the superconductive tapes 1606 and 1610. Similarly, superconductive tapes 1608 and 1612 can be electrically and mechanically joined together along a joint region 1618. A splice 1622 is provided spanning the interface 1616 to provide electrical and mechanical connectivity between the superconductive tapes 1608 and 1612. Joint regions 1618 is shown in more detail in FIG. 17.

Figure 17:
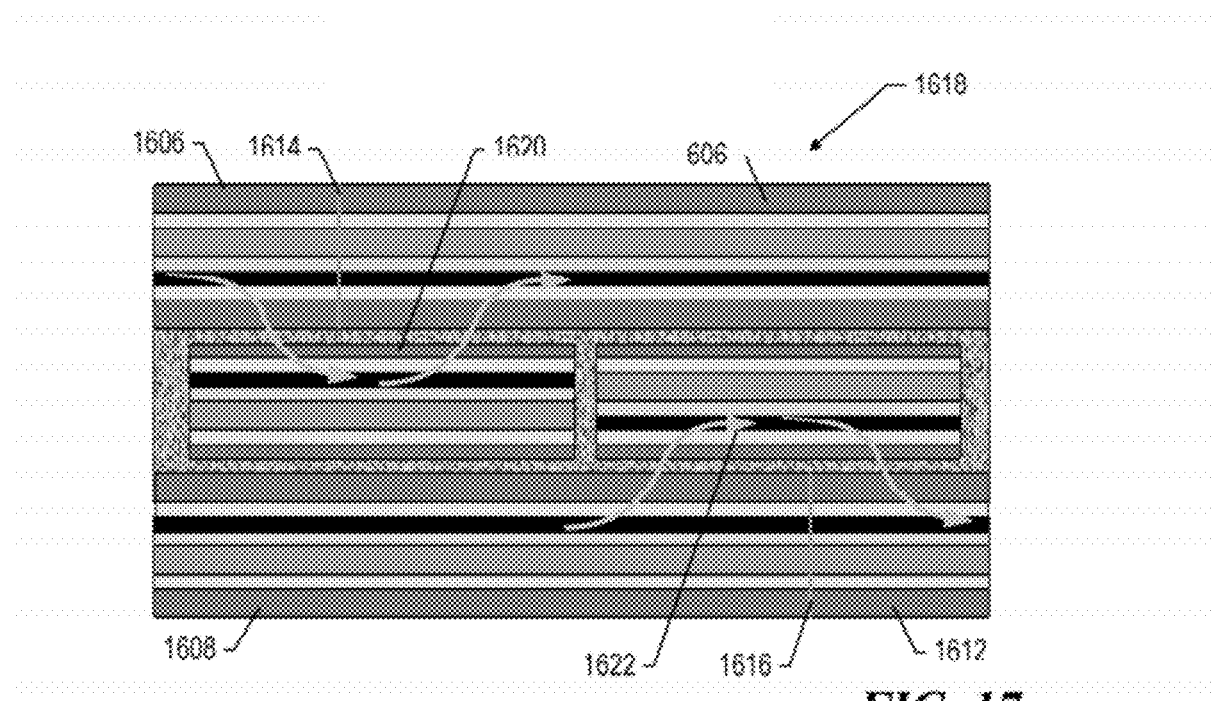
FIG. 17 is an enlarged view of portions of FIG. 16.

FIG. 17 provides a detailed view of joint region 1618. Respective ends of superconductive tapes 1606 and 1610 can be arranged in general abutting or near-abutting contact at an interface 1614. Splice 1620 can span the interface 1614 to provide electrical and mechanical connectivity between the superconductive tapes 1606 and 1610. Similarly, respective ends of superconductive tapes 1608 and 1612 can be arranged in general abutting or near-abutting contact at an interface 1616. Splice 1622 can span the interface 1616 to provide electrical and mechanical connectivity between the superconductive tapes 1608 and 1612.

In an embodiment, splice 1620 is a superconductive tape that is soldered face-to-face with superconductive tapes 1606 and 1610. Electrical current can flow from the superconductive layer of superconductive tape 1606, to the stabilizer layer of superconductive tape 1606, to a bond layer, to the stabilizer layer of splice 1620, and to the superconductive layer of splice 1620. Electrical current can then flow back through the stabilizer layer of splice 1620, to the bond layer, to the stabilizer layer of superconductive tape 1610, then finally to the superconductive layer of superconductive tape 1610. Similarly, splice 1622 is a superconductive tape that is soldered face-to-face with superconductive tapes 1608 and 1612. Electrical current can flow from the superconductive layer of superconductive tape 1608, to the stabilizer layer of superconductive tape 1608, to a bond layer, to the stabilizer layer of splice 1622, and to the superconductive layer of splice 1622. Electrical current can then flow back through the stabilizer layer of splice 1622, to the bond layer, to the stabilizer layer of superconductive tape 1612, then finally to the superconductive layer of superconductive tape 1612.

Figure 18:
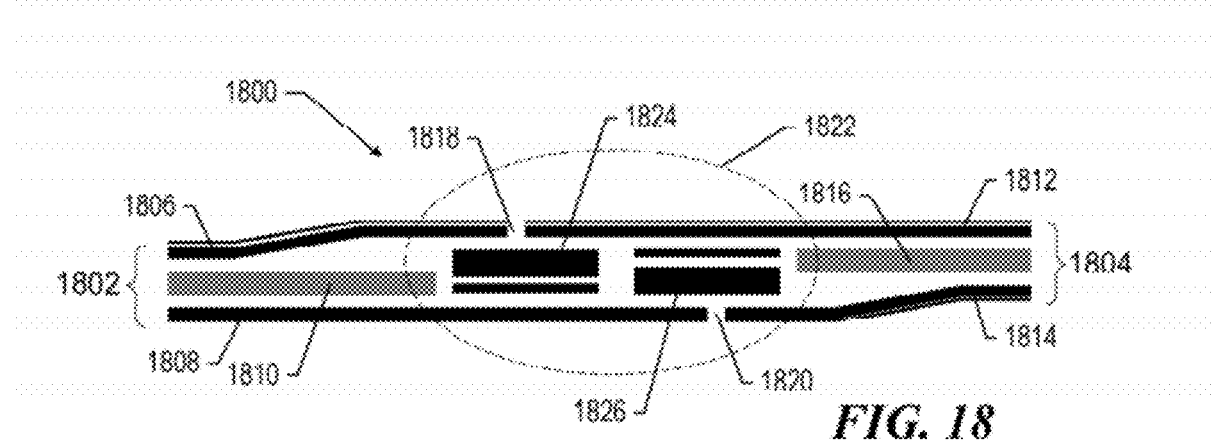
FIG. 18 is a schematic diagram illustrating of another exemplary joint between stacked superconducting articles according to an embodiment.

FIG. 18 illustrates an alternate joint structure in which two stacked superconductive segments 1802 and 1804 are joined together to form a superconductive article 1800. The structure is similar to the structure shown in FIG. 16 with the addition of bulk copper layers between the superconductive tapes of each superconductive segment. Specifically stacked superconductive segment 1802 can include superconductive tapes 1806 and 1808 arranged in a face-to-face configuration with a portion of superconductive tape 1808 extending beyond the end of superconductive tape 1806. Along at least a portion of stacked superconductive segment 1802, bulk copper layer 1810 can be between superconductive tapes 1806 and 1808. Similarly, stacked superconducting article 1804 can include superconductive tapes 1812 and 1814 arranged in a face-to-face configuration with a portion of superconductive tape 1812 extending beyond the end of superconductive tape 1814. Along at least a portion of stacked superconductive segment 1804, bulk copper layer 1816 can be between superconductive tapes 1812 and 1814.

As shown, stacked superconductive segments 1802 and 1804 are arranged end-to-end. Particularly, superconductive tapes 1806 and 1808 are separated at an end of stacked superconductive segment 1802, and superconductive tapes 1812 and 1814 are separated at an end of stacked superconductive segment 1804. The respective ends of superconductive tapes 1806 and 1812 and superconductive tapes 1808 and 1814 are positioned to be in general abutting or near-abutting contact at interfaces 1818 and 1820 respectively. Interfaces 1818 and 1820 can be offset from one another along the length of superconductive article 1800. Additionally, superconductive tapes 1806 and 1812 can be electrically and mechanically joined together along a joint region 1822. A splice 1824 can be provided spanning interface 1818 to provide electrical and mechanical connectivity between the superconductive tapes 1806 and 1812. Similarly, superconductive tapes 1808 and 1812 can be electrically and mechanically joined together along a joint region 1822. A splice 1826 is provided spanning interface 1820 to provide electrical and mechanical connectivity between the superconductive tapes 1808 and 1814. Joint region 1822 is shown in more detail in FIG. 19.

Figure 19:
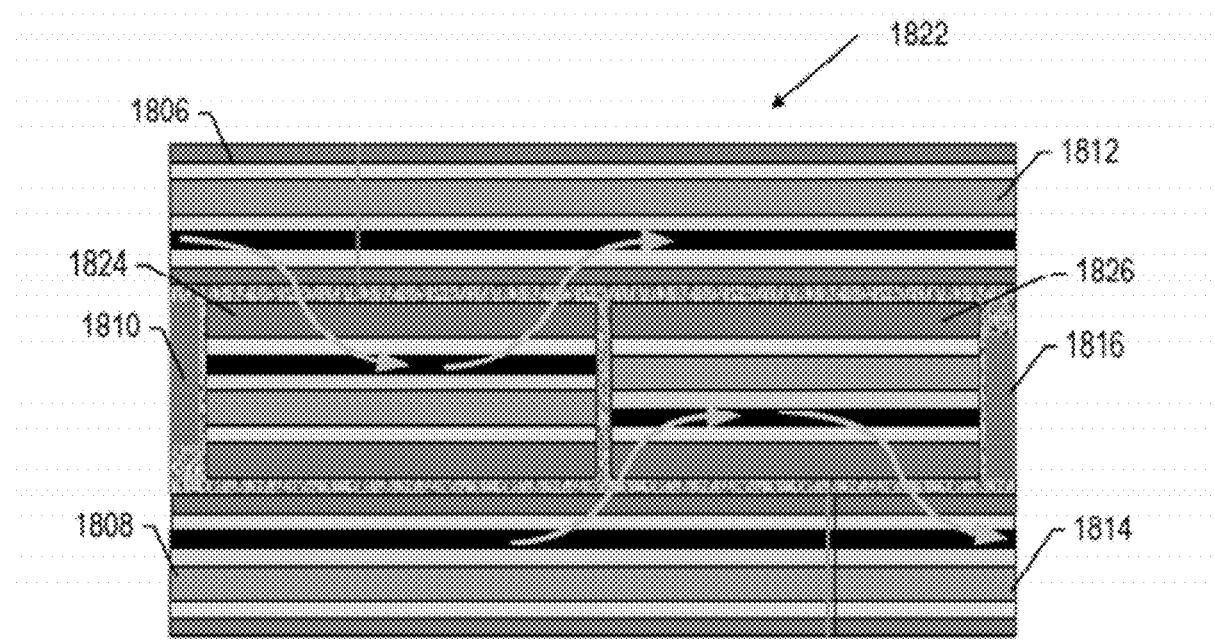
FIG. 19 is an enlarged view of portions of FIG. 18.

FIG. 19 provides a detailed view of joint region 1818. Respective ends of superconductive tapes 1806 and 1812 can be arranged in general abutting or near-abutting contact at an interface 1818. Splice 1824 can span the interface 1818 to provide electrical and mechanical connectivity between the superconductive tapes 1806 and 1812. Similarly, respective ends of superconductive tapes 1808 and 1814 can be arranged in general abutting or near-abutting contact at an interface 1820. Splice 1826 can span interface 1820 to provide electrical and mechanical connectivity between the superconductive tapes 1808 and 1814. Splices 1824 and 1826 can be located within a gap between the ends of bulk copper layers 1810 and 1816.

In an embodiment, splice 1824 is a superconductive tape that is soldered face-to-face with superconductive tapes 1806 and 1812. Electrical current can flow from the superconductive layer of superconductive tape 1806, to the stabilizer layer of superconductive tape 1806, to a bond layer, to the stabilizer layer of splice 1824, and to the superconductive layer of splice 1824. Electrical current can then flow back through the stabilizer layer of splice 1824, to the bond layer, to the stabilizer layer of superconductive tape 1812, then finally to the superconductive layer of superconductive tape 1812. Similarly, splice 1826 is a superconductive tape that is soldered face-to-face with superconductive tapes 1808 and 1814. Electrical current can flow from the superconductive layer of superconductive tape 1808, to the stabilizer layer of superconductive tape 1808, to a bond layer, to the stabilizer layer of splice 1826, and to the superconductive layer of splice 1826. Electrical current can then flow back through the stabilizer layer of splice 1826, to the bond layer, to the stabilizer layer of superconductive tape 1814, then finally to the superconductive layer of superconductive tape 1814.

Turning to the method of forming a stacked superconductive article, two or more superconductive tapes can be provided. The superconductive tapes can be arranged in any of a face-to-face, front-to-back, or back-to-back configuration. Optionally, copper strips can be adjacent to the superconducting face of the superconducting tapes. Either the copper strips can be placed between the superconducting tapes, or the superconducting tapes can be placed between the copper strips. The stacked structure, with or without the copper strips, can be bonded together, such as by using a solder. In an embodiment, the stacked structure can be translated through a bath of molten solder. Alternatively, one or more components, such as the superconducting tapes or the copper strips, can be translated through a bath of molten solder prior to arranging the components together.

Turning to the method of joining two stacked superconductive articles, two stacked superconductive segments can be provided. In certain embodiments, the ends of the stacked superconducting segments can be splayed, such as by heating the ends to melt the bonding layer. In other embodiments, certain components of the stacked superconductive segments can be cut to offset and end portion of the superconductive segments. For example, a length of one superconductive tape can be cut back to offset the ends of the superconductive tapes of the stacked superconductor segment. In another example, the copper strip can be cut back to expose the superconductive face of the superconductive tapes. The ends of the stacked superconductive segments can be arranged, along with any necessary splice segments, and the joint structure can be bonded together, such as by melting solder into the joint.

According to embodiments herein, the joined superconductive article may have a relatively long length, particularly having a dimension as already described above in connection with FIG. 1. In addition, the individual segments may also have relatively extended lengths, such as having a dimension ratio not less than about 100, such as not less than about 1000, or even 10000 or higher. The superconductive article may include additional superconductive segments, further extending the length and dimension ratio of the article, each segment being joined according to the structures and/or techniques described herein. Extended lengths are particularly suitable for long distance current carrying capability, such as traversing an urban area or even traversing extended geographic regions. In addition, a long length, high dimension ratio superconductive article may be particularly advantageous for deployment in coiled or wound structures such as rotating machines and transformers, described below.

Noteworthy, as used herein, the term 'superconductive conductor' is utilized to generally denote a superconductive element, such as either a superconductive segment or a splice. That is, the term is used in a generic sense in the present specification and claims.

According to embodiments herein, it should be clear that the stacked superconductor structures can have an increased current carrying capacity as compared to individual superconducting tapes. Due to the increased current carrying capacity of the stacked superconductor structure, it can be necessary to increase the current carrying capacity of the stabilization layer in order to protect the superconductor material during an overheating situation or an over-current situation. The addition of the bulk copper layer, such as by adding copper strips to the stacked superconductor structures can provide the increased current carrying capacity to the stabilization layer. Significantly, the bulk copper layer can be most effective when the bulk copper layer is adjacent to the superconductive face of the superconductive tapes.

According to embodiments herein, it should be clear that joined superconductive articles are described utilizing a relatively low-profile joint region. This low-profile joint region may be particularly advantageous for various industrial applications, particularly those that would be sensitive to high profiles or exaggerated profiles along the joint region. Oftentimes, conventional lap joints have undesirable excessive profiles, on the order of two times the nominal thicknesses of each of the superconductive segments. Such a thickness or profile may not be tolerated in various applications, and the mechanical performance of the spliced region according to the state of the art lap joints may be compromised.

Note that not all of the activities described above in the general description or the examples are required, that a portion of a specific activity may not be required, and that one or more further activities may be performed in addition to those described. Still further, the order in which activities are listed is not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

After reading the specification, skilled artisans will appreciate that certain features are, for clarity, described herein in the context of separate embodiments, may also be provided in combination in a single embodiment. Conversely, various features that are, for brevity, described in the context of a single embodiment, may also be provided separately or in any subcombination. Further, references to values stated in ranges include each and every value within that range.

While the invention has been illustrated and described in the context of specific embodiments, it is not intended to be limited to the details shown, since various modifications and substitutions can be made without departing in any way from the scope of the present invention. For example, additional or equivalent substitutes can be provided and additional or equivalent production steps can be employed. As such, further modifications and equivalents of the invention herein disclosed may occur to persons skilled in the art using no more than routine experimentation, and all such modifications and equivalents are believed to be within the scope of the invention as defined by the following claims.

What is claimed is:

1. A superconducting article, comprising:
   a first stacked conductor segment having a nominal thickness $t_{n1}$, the first stacked conductor segment including first and second superconductive segments, wherein the first superconductive segment includes a first substrate, a first superconductive layer overlying the first substrate, and a first stabilizer layer overlying the first superconductive layer, the second superconductive segment includes a second substrate, a second superconductive layer overlying the second substrate, and a second stabilizer layer overlying the second superconductive layer, wherein the first and second superconductive segments are arranged so the first superconductive layer and the second substrate are towards the inside of the first stacked conductor segment and the first substrate and the second superconductor layer are towards the outside of the first stacked conductor segment;

a second stacked conductor segment having a nominal thickness $t_{n2}$, the second stacked conductor segment including third and fourth superconductive segments, wherein the third superconductive segment includes a third substrate, a third superconductive layer overlying the third substrate, and a third stabilizer layer overlying the third superconductive layer, and the fourth superconductive segment includes a fourth substrate, a fourth superconductive layer overlying the fourth substrate, and a fourth stabilizer layer overlying the fourth superconductive layer, wherein the third and fourth superconductive segment are arranged so the first superconductive layers and the second substrate are towards the inside of the second stacked conductor segment and the third substrate and fourth superconductive segment are towards the outside of the second stacked conductor segment; and a joint region comprising a first splice connecting the first and third superconductive segments together and a second splice connecting the second and fourth superconductive segments together, the first splice adjacent to and bridging portions of both the first and third superconductive segments along at least a portion of the joint region, the second splice adjacent to and bridging portions of both the second and fourth superconductive segments along at least a portion of the joint region, the joint region having a thickness $t_{jr}$, wherein $t_{jr}$ is not greater than at least one of $1.8t_{n1}$ and $1.8t_{n2}$.

2. The article of claim 1, wherein the first splice comprises a superconductive layer.

3. The article of claim 1, wherein $t_{jr}$ is not greater than at least one of the group consisting of $1.6t_{n1}$ and $1.6t_{n2}$.

4. The article of claim 1, wherein $t_{jr}$ is substantially equal to at least one of $t_{n1}$ and $t_{n2}$.

5. The article of claim 1, wherein the first, second, third, and fourth superconductive segments include first, second, third, and fourth buffer layers, respectively, the first buffer layer being provided between the first substrate and the first superconductive layer, the second buffer layer being provided between the second substrate and the second superconductive layer, the third buffer layer being provided between the third substrate and the third superconductive layer, and the fourth buffer layer being provided between the fourth substrate and the fourth superconductive layer.

6. The article of claim 1, wherein the first and second superconductive segments are arranged so the first and second superconductive layers are towards the inside of the first stacked conductor segment and the first and second substrates are towards the outside of the first stacked conductor segment, and the third and fourth superconductive segments are arranged so the first and second superconductive layers are towards the inside of the second stacked conductor segment and the third and fourth substrates are towards the outside of the second stacked conductor segment.

7. The article of claim 1, wherein the article has a dimension ratio not less than about 100.

8. The article of claim 1, wherein each of the first, second, third, and fourth superconductive segments have a dimension ratio not less than about 10.

9. The article of claim 1, further comprising a bond layer provided between the first splice and the first and third superconductive layers.

10. The article of claim 1, wherein the joint region has a joint resistance of not greater than about 100 nano-ohms cm$^2$.

* * * * *